(12) United States Patent
Tye et al.

(10) Patent No.: US 9,214,314 B1
(45) Date of Patent: Dec. 15, 2015

(54) ION BEAM MANIPULATOR (71) Applicant: Varian Semiconductor Equipment Associates, Inc., Gloucester, MA (US)

(72) Inventors: Jordan B. Tye, Arlington, MA (US); Jeffrey D. Susser, Cambridge, MA (US); Sergio Alonso Gonzalez-Palavicini, Middleton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/643,666

(22) Filed: Mar. 10, 2015

(51) Int. Cl.
*H01J 37/317* (2006.01)
*H01J 37/147* (2006.01)

(52) U.S. Cl.
CPC ........... *H01J 37/147* (2013.01); *H01J 37/3171* (2013.01)

(58) Field of Classification Search
None
See application file for complete search history.

(56) References Cited

U.S. PATENT DOCUMENTS

| 4,976,582 | A | 12/1990 | Clavel | |
|---|---|---|---|---|
| 6,729,202 | B2 * | 5/2004 | Gosselin et al. | 74/490.05 |
| 7,124,660 | B2 * | 10/2006 | Chiang | 74/490.05 |
| 2006/0245894 | A1 * | 11/2006 | Merz et al. | 414/680 |
| 2007/0279768 | A1 * | 12/2007 | Shibazaki | 359/811 |
| 2008/0141813 | A1 * | 6/2008 | Ehrat | 74/490.01 |
| 2008/0142728 | A1 * | 6/2008 | Smick et al. | 250/400 |
| 2009/0019960 | A1 * | 1/2009 | Nabat et al. | 74/490.03 |
| 2009/0321631 | A1 * | 12/2009 | Smick et al. | 250/282 |
| 2011/0129323 | A1 * | 6/2011 | Ehrat | 414/738 |

* cited by examiner

*Primary Examiner* — Phillip A Johnston
*Assistant Examiner* — Sean Luck (57) ABSTRACT

An ion beam manipulator including a suppression electrode, a ground electrode connected to the suppression electrode in a parallel, spaced-apart relationship therewith by three electrically insulating connectors, the connectors being spaced 120 degrees apart from one another around a circumference of the suppression electrode and the ground electrode, a plurality of linkages extending from the electrically insulating connectors, at least one of the linkages including a pair of parallel support arms connected at a first end to a corresponding one of the electrically insulating connecters by a first pair of universal joints and connected at a second end to a bracket by a second pair of universal joints, and a drive shaft extending from the bracket, the drive shaft coupled to an actuator configured to extend and retract the drive shaft along a longitudinal axis of the drive shaft.

20 Claims, 6 Drawing Sheets

ION BEAM MANIPULATOR

FIELD OF THE DISCLOSURE

Embodiments of the present disclosure relate to the field of semiconductor and solar cell processing, and more particularly to an ion beam manipulator for extracting and focusing an ion beam in a desired manner.

BACKGROUND OF THE DISCLOSURE

Ion implantation is a technique for introducing conductivity-altering impurities into a workpiece such as a wafer or other substrate. A desired impurity material is ionized in an ion source of an ion beam implanter, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Conventional ion beam implanters often include a number of extraction electrodes, including a suppression electrode and a ground electrode configured to extract an ion beam from an ion source and to manipulate (e.g., focus and/or direct) the ion beam in a desired manner. The extraction electrodes are commonly mounted on an electrode positioning system having a motorized, multi-axis gantry for facilitating selective movement of the extraction electrodes relative to the ion source. For example, if an ion beam is out of focus when the ion beam is initially extracted from the ion source, the gantry may reposition the extraction electrodes in a corrective manner to focus the ion beam properly. It is advantageous to perform such corrective focusing quickly and precisely in order to reduce processing times and to produce workpieces with good micro-uniformity.

Traditional electrode positioning systems such as the one described above are associated with a number of shortcomings. For example, motorized gantries employed in such systems may exhibit less than optimal response times and positional accuracy. Additionally, such systems are often very large, often with components extending outside of a vacuum sealed source chamber containing an ion source and extraction electrodes, therefore requiring large and complicated vacuum sealing arrangements. Still further, traditional electrode positioning systems are often very expensive, have significant axis coupling and motion profile limitations, and are difficult to modify.

SUMMARY

This Summary is provided to introduce a selection of concepts in a simplified form further described below in the Detailed Description. This Summary is not intended to identify key features or essential features of the claimed subject matter, nor is this Summary intended as an aid in determining the scope of the claimed subject matter.

An exemplary embodiment of an ion beam manipulator in accordance with the present disclosure may include an extraction electrode and a plurality of linkages extending from the extraction electrode, at least one of the linkages including a pair of parallel support arms connected at a first end to the extraction electrode by a first pair of universal joints and connected at a second end to a bracket by a second pair of universal joints, and a drive shaft extending from the bracket, the drive shaft coupled to an actuator configured to extend and retract the drive shaft along a longitudinal axis of the drive shaft.

Another exemplary embodiment of an ion beam manipulator in accordance with the present disclosure may include a suppression electrode, a ground electrode connected to the suppression electrode in a parallel, spaced-apart relationship therewith by a plurality of electrically insulating connectors, the connectors being spaced 120 degrees apart from one another around axes of the suppression electrode and the ground electrode, a plurality of linkages extending from the plurality of electrically insulating connectors, at least one of the linkages including a pair of parallel support arms connected at a first end to a corresponding one of the electrically insulating connecters by a first pair of universal joints and connected at a second end to a bracket by a second pair of universal joints, and a drive shaft extending from the bracket, the drive shaft coupled to an actuator configured to extend and retract the drive shaft along a longitudinal axis of the drive shaft.

An exemplary embodiment of an ion implanter in accordance with the present disclosure may include a source chamber, an ion source disposed within the source chamber and configured to generate an ion beam, and an ion beam manipulator disposed within the source chamber adjacent the ion source and configured to extract and focus the ion beam, the ion beam manipulator including an extraction electrode and a plurality of linkages extending from the extraction electrode, at least one of the linkages including a pair of parallel support arms connected at a first end to the extraction electrode by a first pair of universal joints and connected at a second end to a bracket by a second pair of universal joints, and a drive shaft extending from the bracket, the drive shaft coupled to an actuator configured to extend and retract the drive shaft along a longitudinal axis of the drive shaft.

BRIEF DESCRIPTION OF THE DRAWINGS

By way of example, various embodiments of the disclosed apparatus will now be described, with reference to the accompanying drawings, wherein.

DETAILED DESCRIPTION

An apparatus for manipulating an ion beam in accordance with the present disclosure will now be described more fully with reference to the accompanying drawings, wherein certain exemplary embodiments of the apparatus are presented. The apparatus may be embodied in many different forms and are not to be construed as being limited to the embodiments set forth herein. These embodiments are presented to provide a thorough and complete disclosure. In the drawings, like numbers refer to like elements throughout.

The disclosed apparatus is described in connection with ion implantation processes. While ion implantation of solar cells is specifically mentioned, the disclosed apparatus can be used for the implantation of other workpieces such as, for example, semiconductor wafers, flat panels, light-emitting diodes (LEDs), and the like. Thus, the present disclosure is not limited to the specific embodiments described below.

Figure 1:
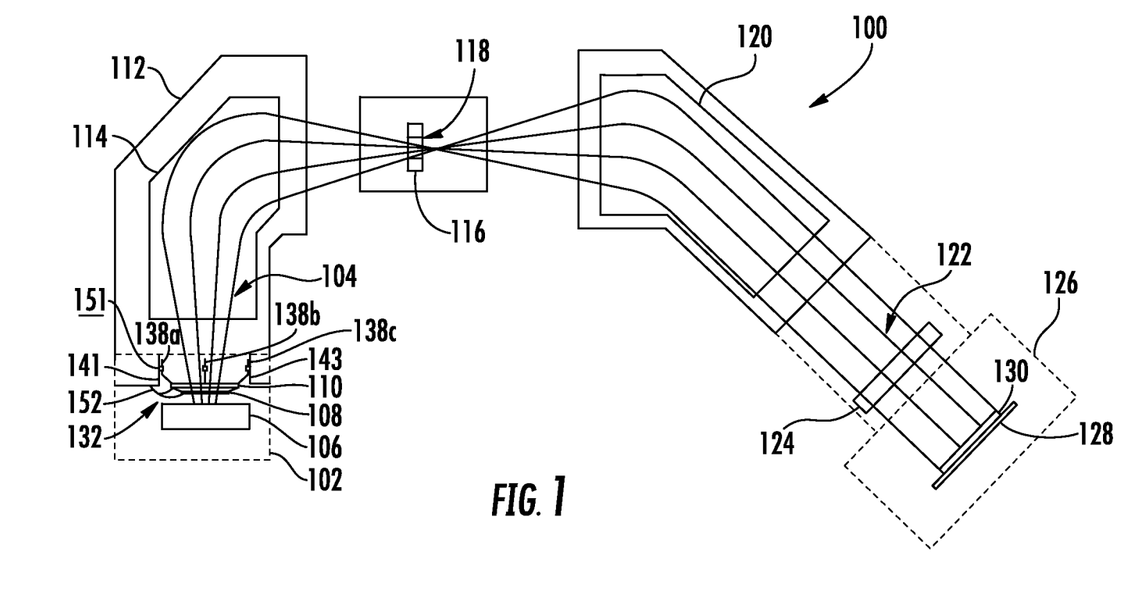
FIG. 1 is a schematic plan view illustrating an exemplary embodiment of a beam line ion implanter in accordance with the present disclosure.

FIG. 1 is a schematic diagram of a beam-line ion implanter (hereinafter "the implanter 100"). The implanter 100 is one of many examples of beam-line ion implanters capable of producing and direct an ion beam for doping substrates. Thus, the apparatus described herein is not limited to application solely in the exemplary implanter 100 shown in FIG. 1. The implanter 100 is not restricted to "beam-line" designs, and could include other types of ion implanters based on plasma immersion, flood, or other plasma source designs, for example.

Generally, the implanter 100 may include a source chamber 102 configured to generate ions for forming an ion beam 104. The source chamber 102 may include an ion source 106 where a feed gas supplied to the ion source 106 is ionized. This feed gas may be, or may include or contain, hydrogen, helium, other rare gases, oxygen, nitrogen, arsenic, boron, phosphorus, aluminum, indium, gallium, antimony, carborane, alkanes, another large molecular compound, or other p-type or n-type dopants, for example. The generated ions may be extracted from the ion source 106 by a series of extraction electrodes, including a suppression electrode 108 and a ground electrode 110 configured to focus and direct the ion beam 104 as further described below. The extracted ion beam 104 may be mass analyzed by a mass analyzer 112 including a resolving magnet 114 and a masking electrode 116 having a resolving aperture 118. The resolving magnet 114 deflects certain ions in the ion beam 104 to allow ions having a desired mass-to-charge ratio associated with a particular dopant ion species to pass through the resolving aperture 118. The undesired ion species do not pass through the resolving aperture 118, since such species are blocked by the masking electrode 116.

Ions of the desired ion species may pass through the resolving aperture 118 to an angle corrector magnet 120. The angle corrector magnet 120 may deflect ions of the desired ion species to convert the ion beam from a diverging ion beam to a ribbon ion beam 122 having generally parallel ion trajectories. The implanter 100 may further include acceleration and/or deceleration units in some embodiments. Acceleration and deceleration units may be used in ion implant systems to speed up or slow down an ion beam. Speed adjustment is accomplished by applying specific combinations of voltage potentials to sets of electrodes disposed on opposite sides of an ion beam. As an ion beam passes between the electrodes, ion energies are increased or decreased depending on the applied voltage potentials. Since the depth of an ion implant is proportional to the energy of an impinging ion beam, beam acceleration may be desirable when performing deep ion implants. Conversely, where shallow ion implants are desired, beam deceleration may be performed to ensure impinging ions travel just a short distance into a workpiece. The exemplary implanter 100 shown in FIG. 1 includes a deceleration unit 124.

An end station 126 of the implanter 100 may include a platen 128 configured to support one or more workpieces, such as a substrate 130, disposed in the path of ribbon ion beam 122. The substrate 130 may be, for example, a semiconductor wafer, solar cell, etc. The end station 126 also may include a scanner (not shown) for moving the substrate 130 perpendicular to the long dimension of the ribbon ion beam 122 cross-section, accordingly distributing ions over the entire surface of the substrate 130. Although a ribbon ion beam 122 is illustrated, other embodiments if the implanter 100 may provide a spot beam. The entire path traversed by the ion beam 104 may be evacuated during ion implantation. The implanter 100 may further include additional components known to those skilled in the art and may incorporate hot or cold implantation of ions in some embodiments.

Still referring to FIG. 1, the suppression electrode 108 and the ground electrode 110 may be integral components of an ion beam manipulator (hereinafter "the manipulator 132") located within the source chamber 102. The manipulator 132 may be provided for selectively adjusting the positions of the suppression electrode 108 and the ground electrode 110 relative to the ion source 106, such as for focusing the extracted ion beam 104 in a desired manner. As will be described in greater detail below, the manipulator 132 may be entirely contained within the source chamber 102, and may generally be smaller, less expensive, faster responding, and may have greater positional accuracy relative to conventional, multi-axis gantries commonly employed in ion beam implanters for adjusting the positions of extraction electrodes.

Figure 2A:
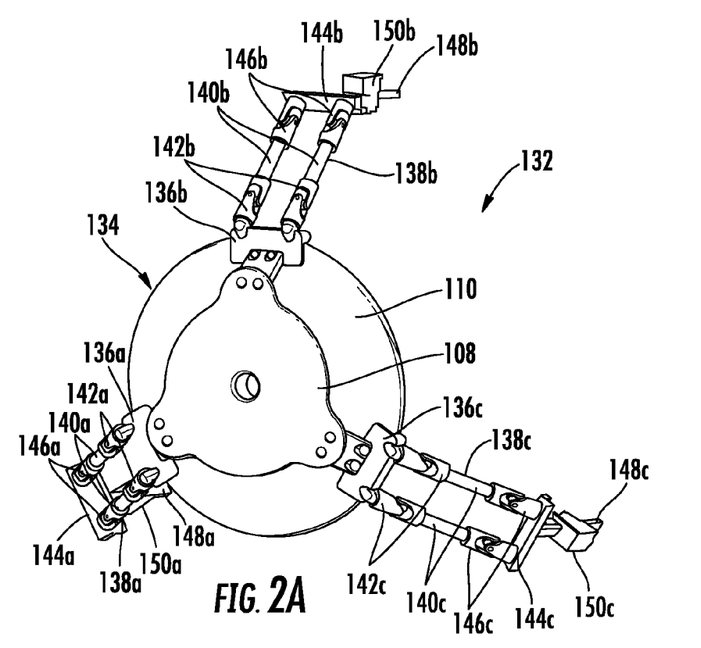
FIG. 2a is a front isometric view illustrating an exemplary embodiment of an ion beam manipulator in accordance with the present disclosure.
Figure 2B:
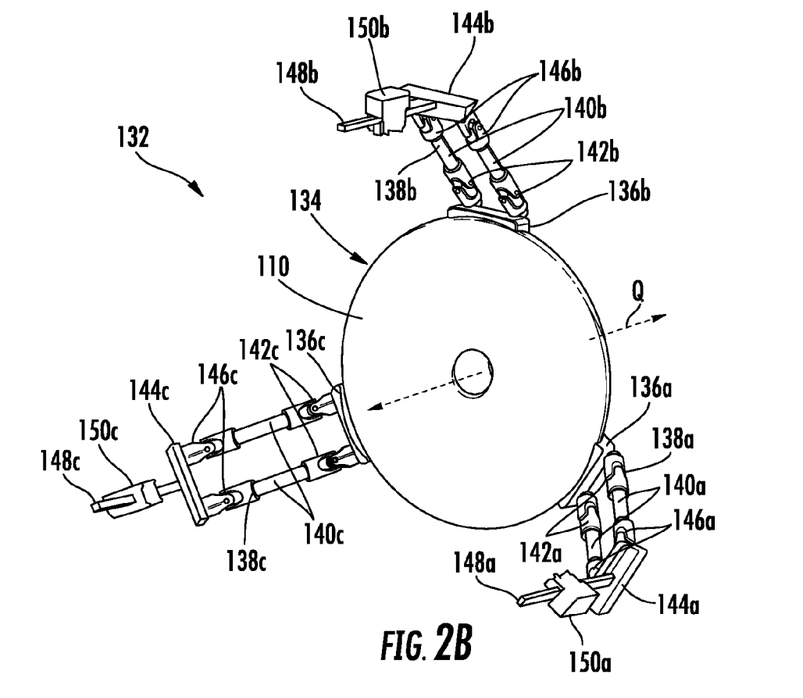
FIG. 2b is a reverse isometric view illustrating the ion beam manipulator of the present disclosure.

Referring to FIGS. 2a and 2b, front and rear isometric views illustrating the manipulator 132 are shown. The manipulator 132 may be a delta robot-style mechanism having a payload 134 including the suppression electrode 108, the ground electrode 110, and electrically insulating connectors 136a, 136b, 136c holding the suppression electrode 108 and the ground electrode 110 together in a desired spaced-apart relationship. In the illustrated embodiment the suppression electrode 108 and the ground electrode 110 are held in a parallel relationship. Other relative orientations the suppression electrode 108 and the ground electrode 110 are contemplated. The insulating connectors 136a, 136b, 136c may be formed of any type of electrically insulating material suitable for use within the source chamber 102, including, without limitation, not limited to quartz, ceramics such as alumina and zirconia, various thermoplastics, and high temperature thermosets such as epoxy. While the illustrated manipulator 132 includes three insulating connectors 136a, 136b, 136c evenly spaced around the circumferences of the suppression electrode 108 and the ground electrode 110, the manipulator 132 may include a greater or fewer number of insulating connectors having various arrangements and/or configurations.

The manipulator 132 may further include three linkages 138a, 138b, 138c connecting the payload 134 to interior surfaces 141, 143 of the source chamber 102 as shown in FIG. 1 (a top interior surface of the source chamber 102 is not shown for clarity). Referring again to FIGS. 2a and 2b, the linkages 138a, 138b, 138c may be connected to the payload 134 at positions spaced 120 degrees apart from one another around an imaginary central axis Q (FIG. 2b). For example, if the payload 134 is viewed from the front, the linkage 138a may be connected to the payload 134 at an 8 o'clock position, the linkage 138b may be connected to the payload 134 at a 12 o'clock position, and the linkage 138c may be connected to the payload 134 at a 4 o'clock position. The linkages 138a, 138b, 138c may be connected to the insulating connectors 136a, 136b, 136c as shown in FIGS. 2a and 2b. In other embodiments, the linkages 138a, 138b, 138c may be connected directly to the suppression electrode 108 and/or the ground electrode 110, as long as a desired electrical separation is maintained between the suppression electrode 108 and the ground electrode 110.

The linkages 138a, 138b, 138c may be of identical design. Thus, for the sake of convenience and clarity, just the linkage 138c will be described in detail below. The following description shall therefore also apply to the other linkages 138a, 138*b* (with respective element reference numbers including the respective "a" or "b" suffix).

The linkage 138*c* may extend from the payload 134 in a radially outward and rearward direction as shown in FIGS. 2*a* and 2*b* or, alternatively, the linkage 138*c* may extend from the payload 134 in a radially outward and forward direction. The linkage 138*c* may include a pair of parallel support arms 140*c* connected at a first, front end to the payload 134 by a first pair of universal joints 142*c* and connected at a second, rear end to a bracket 144*c* by a second pair of universal joints 146*c*. The term "universal joint" is used herein to refer to any type of mechanical coupling adapted to facilitate pivoting of two structures in any direction relative to one another. The first and second pairs of universal joints 142*c*, 146*c* may allow the support arms 140*c* to freely pivot over a wide range of angles relative to the payload 134 and the bracket 144*c* while maintaining a parallel relationship between the support arms 140*c*. The parallel support arms 140*c* may be formed of any type of electrically insulating material suitable for use within the source chamber 102, including, without limitation, quartz, ceramics such as alumina and zirconia, various thermoplastics, and high temperature thermosets such as epoxy.

A drive shaft 148*c* may be connected to the bracket 144*c* and may extend perpendicularly rearward therefrom. The drive shaft 148*c* may be operatively connected to an actuator 150*c* mounted to the interior surface 143 (FIG. 1) of the source chamber 102. The actuator 150*c* may be configured to controllably move the drive shaft 148*c* forward and rearward along a longitudinal axis thereof. In one embodiment the manipulator 132 may be operatively connected to a controller 151 (FIG. 1) configured to command the actuator 150*c* to extend or retract the drive shaft 148*c* in order to reposition the payload 134 as further described below. In one non-limiting example, the actuator 150*c* may be a piezoelectric motor selected for having a relatively low cost, a small size, a fast response time, and high positional accuracy. Alternatively, the actuator 150*c* may be any type of drive mechanism appropriate for implementation within the high voltage, highly magnetic, vacuum environment of the source chamber 102 and capable of selectively extending and retracting the drive shaft 148*c*. While the actuator 150*c* is shown as being located within the source chamber 102, the actuator 150*c* may alternatively be partially or entirely located outside of the source chamber 102 and may engage the drive shaft 148*c* via a vacuum-sealed pass-through in the source chamber 120.

Figure 3A:
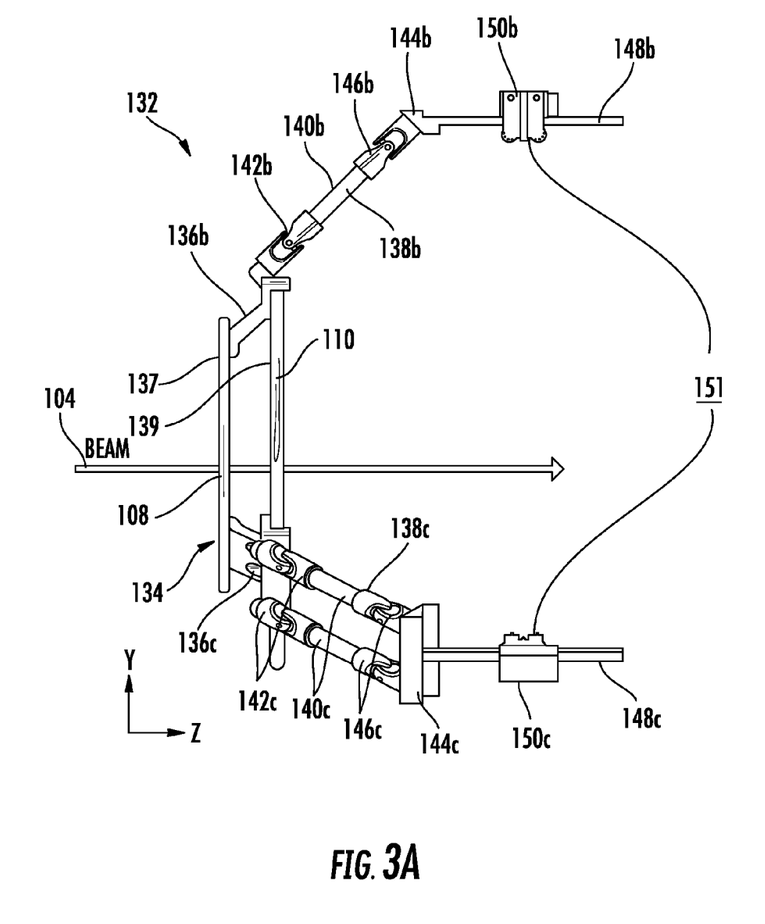
FIGS. 3a and 3b are a sequence of right side views illustrating exemplary movements of the ion beam manipulator of the present disclosure.
Figure 3B:
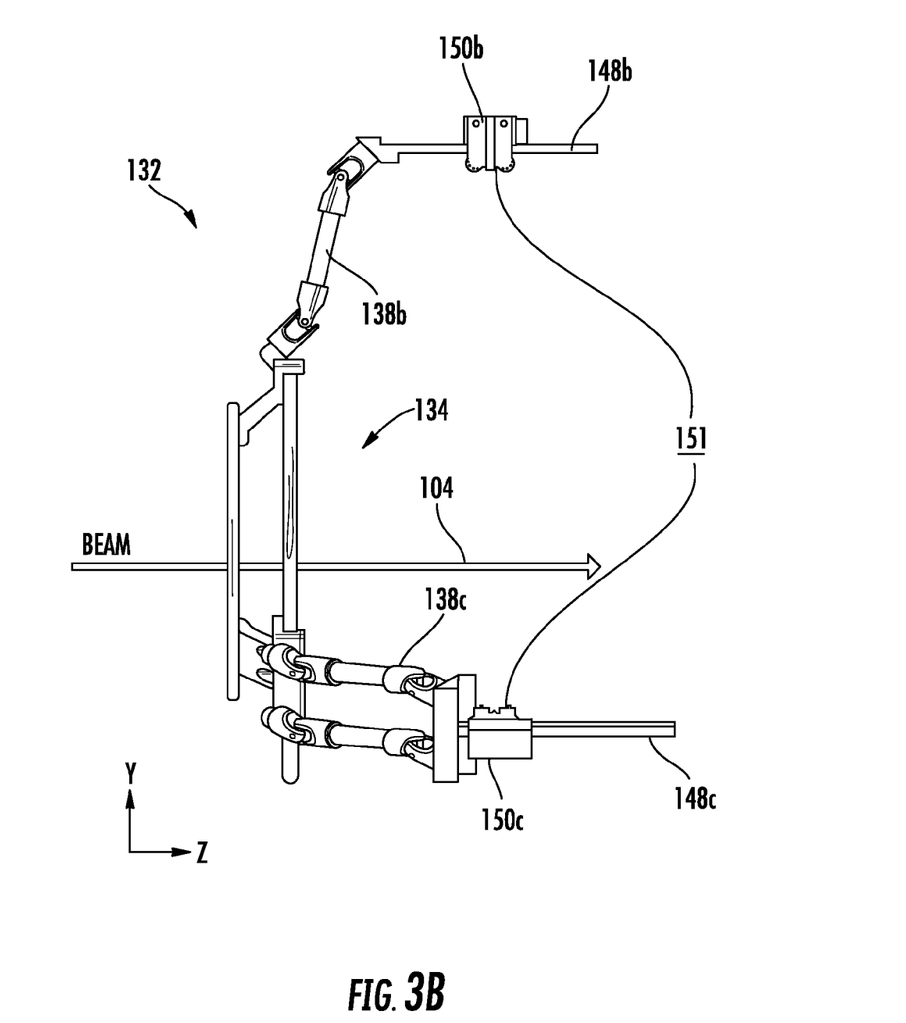

During operation of the manipulator 132, the actuators 150*a*, 150*b*, 150*c* associated with the linkages 138*a*, 138*b*, 138*c* may be operated in a cooperative manner to reposition the suppression electrode 108 and the ground electrode 110 relative to the ion source 106 of the implanter 100, such as for focusing the extracted ion beam 104 in a desired manner. For example, referring to the right side view of the manipulator 132 shown in FIG. 3*a*, if the suppression electrode 108 and the ground electrode 110 are determined, through measurement of the ion beam 104, to be initially positioned too high and too far forward relative to the ion source 106 (FIG. 1) to achieve a desired focus of the ion beam 104, the controller 151 may command the lower left and lower right actuators 150*a*, 150*c* (the lower left actuator 150*a* is not visible in FIGS. 3*a* & 3*b*) to retract their respective drive shafts 148*a*, 148*c* while the top drive shaft 148*b* remains relatively extended. In this manner, the aspects of the linkages 138*a*, 138*c* extending between the actuators 150*a*, 150*c* and the payload 134 are extended in the z-direction, causing the payload 134 to be pulled down (in the y direction) and rearward (in the z direction) as shown in FIG. 3*b*. The suppression electrode 108 and the ground electrode 110 may accordingly be correctively repositioned to focus the extracted ion beam 104.

Figure 4A:
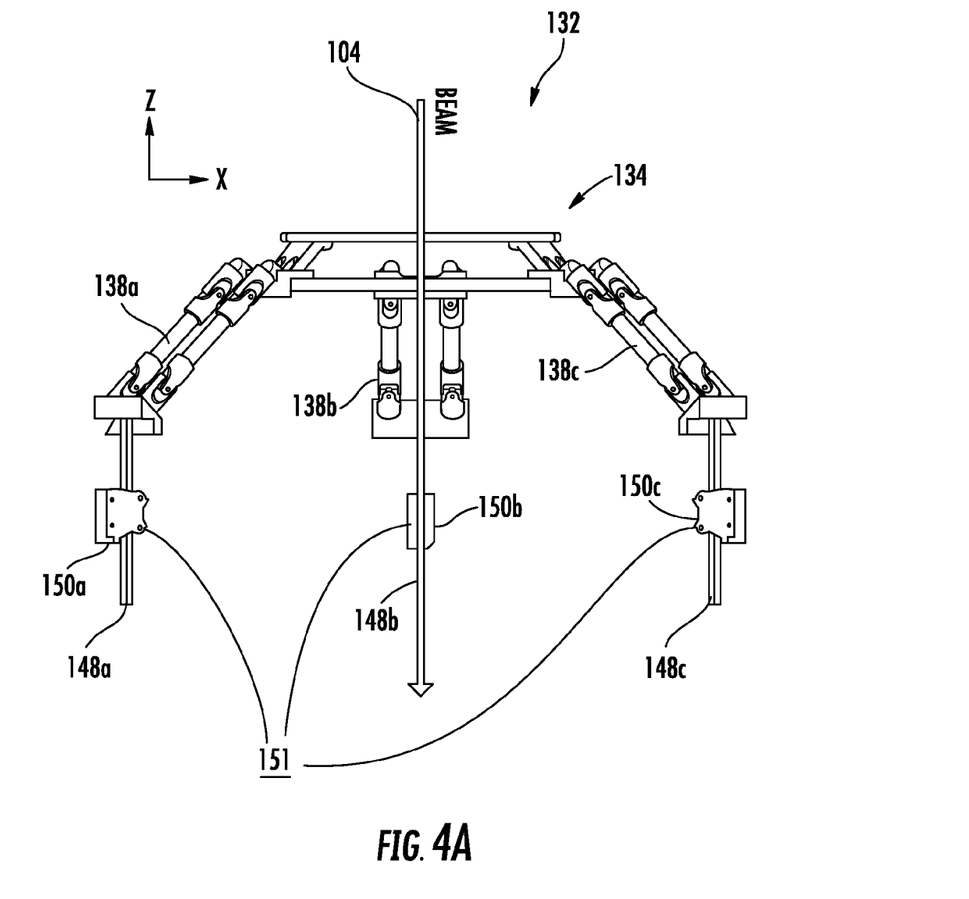
FIGS. 4a and 4b are a sequence of bottom views illustrating exemplary movements of the ion beam manipulator of the present disclosure.
Figure 4B:
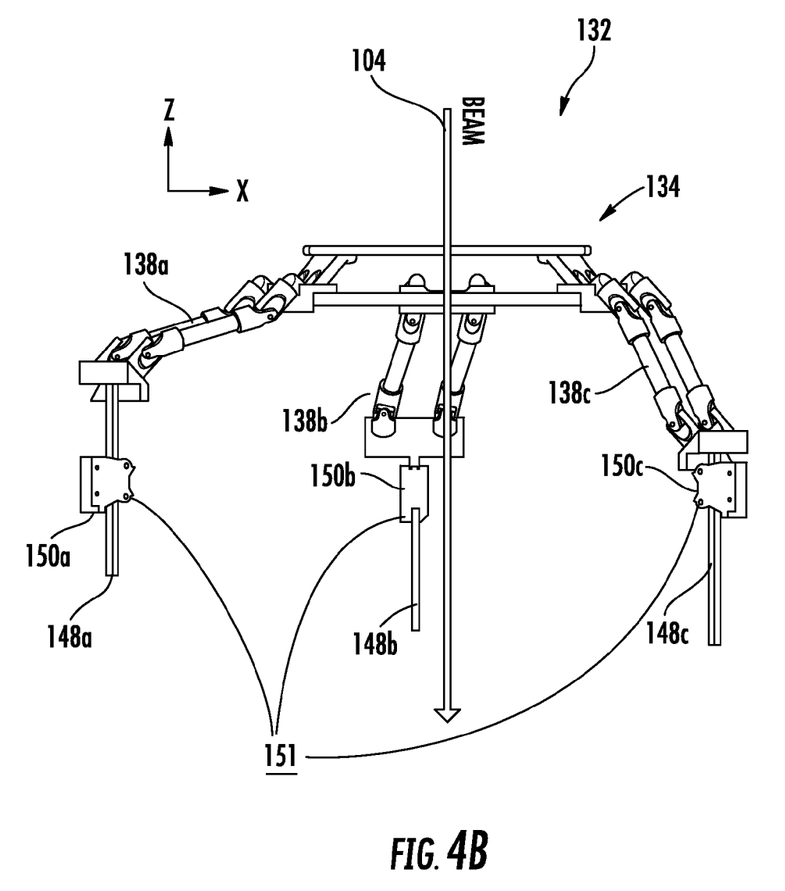

In another example, referring to the bottom view of the manipulator 132 shown in FIG. 4*a*, if the suppression electrode 108 and the ground electrode 110 are determined, through measurement of the ion beam 104, to initially be positioned too far left and too far forward to achieve a desired focus of the ion beam 104, the controller 151 may command the top actuator 150*b* and the lower right actuators 150*c* to retract their respective drive shafts 148*b*, 148*c* while the lower left drive shaft 148*a* remains relatively extended. The aspects of the linkages 138*b*, 138*c* extending between the actuators 150*b*, 150*c* and the payload 134 are reduced in the z-direction, causing the payload 134 to be pulled right (in the x direction) and rearward (in the z direction) as shown in FIG. 4*b*. The suppression electrode 108 and the ground electrode 110 may accordingly be correctively repositioned to focus the extracted ion beam 104.

By varying the relative longitudinal positions of the drive shafts 148*a*, 148*b*, 148*c*, the payload 134 may be moved to virtually any position within a predefined Cartesian range, wherein such range may be dictated by the positions of the actuators 150*a*, 150*b*, 150*c*, the lengths of the drive shafts 148*a*, 148*b*, 148*c*, and the lengths of the support arms 140*a*, 140*b*, 140*c*. Thus, the range of motion of the manipulator 132 may be easily modified (e.g., extended) by modifying the positions of the actuators 150*a*, 150*b*, 150*c*, the lengths of the drive shafts 148*a*, 148*b*, 148*c*, and/or the lengths of the support arms 140*a*, 140*b*, 140*c*.

Since the support arms 140*a*, 140*b*, 140*c* are connected to the payload 134 and to their respective brackets 144*a*, 144*b*, 144*c* by the universal joints 142*a*, 142*b*, 142*c* and 146*a*, 146*b*, 146*c*, the payload 134 may be repositioned in the x, y, and z directions via extension and retraction of the drive shafts 148*a*, 148*b*, 148*c* while maintaining the orientation of the payload 134. Regardless of the relative longitudinal positions of the drive shafts 148*a*, 148*b*, 148*c*, the major faces 137, 139 (see FIG. 3*a*) of the suppression electrode 108 and the ground electrode 110 can always remain perpendicular to the axes of the drive shafts 148*a*, 148*b*, 148*c*. The payload 134 may accordingly be strictly limited to three degrees of freedom (i.e., movement in the x, y, and z directions). Alternatively, the manipulator 132 may be supplemented with additional structures and/or mechanisms for providing the payload 134 with additional degrees of freedom, such the ability to selectively tilt and/or rotate. For example, additional degrees of freedom may be achieved by varying the number, configuration, and/or type of support arms, joints, or actuators in one or more of the linkages 138*a*, 138*b*, 138*c*, by implementing one or more additional linkages, and/or by connecting additional actuators (e.g., piezoelectric actuators) directly to the payload 134.

Referring again to FIG. 1, various electrical connections for grounding and/or supplying electrical power to the suppression electrode 108 and the ground electrode 110 may be routed to the payload 134 through a flexible conduit 152 extending between the interior surface 141 of the source chamber 102 and the payload 134. In one non-limiting embodiment, the flexible conduit 152 may be an extendable and retractable spring-type conduit for allowing the payload 134 to move freely within the source chamber 102 while maintaining electrical connections thereto. In an alternative embodiment of the manipulator 132, the described electrical connections, including or omitting the conduit 152, may be routed through one or more of the linkages 138*a*, 138*b*, 138*c*.

In view of the foregoing description, the exemplary manipulator 132 may provide numerous advantages relative to conventional, multi-axis gantries commonly employed in ion beam implanters for adjusting the positions of extraction electrodes. For example, the manipulator 132 may have a faster response time, greater positional accuracy, and may be implemented at a much lower cost relative to a multi-axis gantry system. Additionally, the manipulator 132 is relatively small and may therefore be entirely contained within the source chamber 102, accordingly eliminating the need for complicated and expensive sealing arrangements often necessary for large, multi-axis gantry systems having components extending outside of a source chamber. Still further, the manipulator 132 may be easily reconfigured through modification of the arrangement and/or size of the actuators 150a, 150b, 150c, the drive shafts 148a, 148b, 148c, and/or the support arms 140a, 140b, 140c. Still further, the manipulator 132 does not suffer from the axis coupling limitations commonly associated with multi-axis gantry systems.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize the usefulness of the present disclosure is not limited thereto. The present disclosure may be beneficially implemented in any number of environments for any number of purposes. Accordingly, the claims set forth below are to be construed in view of the full breadth and spirit of the present disclosure as described herein.

The invention claimed is:

1. An ion beam manipulator, comprising:
   an extraction electrode; and
   a plurality of linkages extending from the extraction electrode, at least one of the linkages comprising:
      a pair of parallel support arms connected at a first end to the extraction electrode by a first pair of universal joints and connected at a second end to a bracket by a second pair of universal joints; and
      a drive shaft connected to the bracket, the drive shaft coupled to an actuator configured to extend and retract the drive shaft along a longitudinal axis of the drive shaft.

2. The ion beam manipulator of claim 1, wherein the extraction electrode comprises a suppression electrode and a ground electrode.

3. The ion beam manipulator of claim 2, wherein the suppression electrode and the ground electrode are connected to one another in a parallel, spaced-apart relationship by an electrically insulating connector.

4. The ion beam manipulator of claim 3, wherein the first pair of universal joints is connected to the electrically insulating connector.

5. The ion beam manipulator of claim 1, wherein the plurality of linkages comprises three linkages, the three linkages connected to the extraction electrode at positions spaced 120 degrees apart from one another around an imaginary central axis.

6. The ion beam manipulator of claim 1, wherein the actuator is a piezoelectric actuator.

7. The ion beam manipulator of claim 1, wherein the drive shaft is oriented perpendicular to a major face of the extraction electrode.

8. An ion beam manipulator, comprising:
   a suppression electrode;
   a ground electrode connected to the suppression electrode in a parallel, spaced-apart relationship by a plurality of electrically insulating connectors, the plurality of electrically insulating connectors spaced 120 degrees apart from one another around a circumference of the suppression electrode and a circumference of the ground electrode; and
   a plurality of linkages extending from the plurality of electrically insulating connectors, at least one of the linkages comprising:
      a pair of parallel support arms connected at a first end to a corresponding one of the plurality of electrically insulating connecters by a first pair of universal joints and connected at a second end to a bracket by a second pair of universal joints; and
      a drive shaft connected to the bracket, the drive shaft coupled to an actuator configured to extend and retract the drive shaft along a longitudinal axis of the drive shaft.

9. The ion beam manipulator of claim 8, wherein the actuator is piezoelectric actuator.

10. The ion beam manipulator of claim 8, wherein the drive shaft is oriented perpendicular to respective major faces of the suppression electrode and the ground electrode.

11. An ion implanter, comprising:
    a source chamber;
    an ion source disposed within the source chamber and configured to generate an ion beam; and
    an ion beam manipulator disposed within the source chamber adjacent the ion source and configured to extract and focus the ion beam, the ion beam manipulator comprising:
       an extraction electrode; and
       a plurality of linkages coupled to the extraction electrode, at least one of the plurality of linkages comprising:
          a pair of parallel support arms connected at a first end to the extraction electrode by a first pair of universal joints and connected at a second end to a bracket by a second pair of universal joints; and
          a drive shaft connected to the bracket, the drive shaft coupled to an actuator configured to extend and retract the drive shaft along a longitudinal axis of the drive shaft.

12. The ion implanter of claim 11, wherein the extraction electrode comprises a suppression electrode and a ground electrode.

13. The ion implanter of claim 12, wherein the suppression electrode and the ground electrode are connected to one another in a parallel, spaced-apart relationship by an electrically insulating connector.

14. The ion implanter of claim 13, wherein the first pair of universal joints is connected to the insulating connector.

15. The ion implanter of claim 11, wherein the plurality of linkages comprises three linkages, the three linkages connected to the extraction electrode at positions spaced 120 degrees apart from one another around an imaginary central axis.

16. The ion implanter of claim 11, wherein the drive shaft is oriented perpendicular to a major face of the extraction electrode.

17. The ion implanter of claim 11, further comprising a controller operatively connected to the actuators of the plurality of linkages, the controller configured to command the actuators in a cooperative manner to move the extraction electrode relative to the ion source.

18. The ion implanter of claim 17, wherein the controller is configured to command the actuators to reposition the extraction electrode to change a focus of the ion beam.

19. The ion implanter of claim 11, wherein the ion beam manipulator is entirely contained within the source chamber.

20. The ion implanter of claim 11, wherein the extraction electrode comprises a suppression electrode and a ground electrode connected to one another in a parallel, spaced-apart relationship by an electrically insulating connector, the plurality of linkages comprises three linkages connected to the extraction electrode at positions spaced 120 degrees apart from one another around an imaginary central axis, the drive shafts of the linkages are oriented perpendicular to major faces of the suppression electrode and the ground electrode, and wherein the ion implanter further comprises a controller operatively connected to the actuators of the linkages, the controller configured to command the actuators of the linkages in a cooperative manner to move the suppression electrode and the ground electrode relative to the ion source.

\* \* \* \* \*